United States Patent [19] [11] 4,361,641
Angus et al. [45] Nov. 30, 1982

[54] ELECTROLYTIC SURFACE MODULATION

[75] Inventors: John C. Angus, Cleveland Heights, Ohio; Kathleen M. Tomaswick, Arnold, Pa.; Uziel Landau, Cleveland Heights, Ohio

[73] Assignee: University Patents, Inc., Norwalk, Conn.

[21] Appl. No.: 320,142

[22] Filed: Nov. 10, 1981

[51] Int. Cl.³ .............................................. G03C 5/00
[52] U.S. Cl. .................................... 430/313; 430/314; 430/315; 430/323; 430/324; 204/29; 204/38 E; 204/38 R; 204/129.65
[58] Field of Search ............... 430/313, 324, 323, 314, 430/315, 5; 204/29, 38 E, 38 R, 129.65, 14 R, 15, 18.1, 192 N

[56] References Cited

U.S. PATENT DOCUMENTS

| | | | |
|---|---|---|---|
| 3,791,858 | 2/1974 | McPherson et al. | 117/201 |
| 3,930,857 | 1/1976 | Bendz et al. | 96/36.2 |
| 3,986,939 | 10/1976 | Prest | 204/15 |
| 4,024,631 | 5/1977 | Castillero | 29/625 |
| 4,217,183 | 8/1980 | Melcher et al. | 204/15 |
| 4,247,377 | 1/1981 | Eckler et al. | 204/129.65 |
| 4,325,780 | 4/1982 | Schulz, Sr. | 156/659.1 |

Primary Examiner—John E. Kittle
Assistant Examiner—Jose' G. Dees
Attorney, Agent, or Firm—Jerome M. Teplitz; A. Sidney Alpert; David N. Koffsky

[57] ABSTRACT

The surface of an electrically conductive substrate is electrolytically modulated to a predetermined profile by subjecting the surface to electrodeposition or electrodissolution through ionically conductive body portions of an ionic conductance resist which masks the surface. The rate of passage of ionic species to or from any given point along the masked surface is controlled by the trans-resist ionic conductance or resistance at that point. The predetermined surface profile is generated by providing the resist with a trans-resist ionic conductance or resistance profile which patterns the predetermined surface profile.

10 Claims, No Drawings

ELECTROLYTIC SURFACE MODULATION

BACKGROUND OF THE INVENTION

The invention described herein was made in the course of work conducted under a grant or award from the National Science Foundation.

This invention relates to the modulation of metallic and other electrically conductive surfaces to a predetermined profile and, more particularly, to electrolytic procedures for effecting such surface modulation.

Electrodeposition through an apertured mask or resist is a well-known technique for modulating metallic and other electrically conductive surfaces. In the prior art procedures, the body portions of the resists employed are totally impervious to ionic flow, so that electroplating of the ions from the plating solution onto the surface being modulated takes place only through the apertured portions of the resists. Consequently, these procedures are of very limited applicability, and are not well suited for those applications where the surface modulation profile is desired to be continuous and/or of varying depth and/or characterized by extremely fine features.

The apertured resists employed in the above-described procedures can be, for example, formed by exposing a photosensitive polymeric film to light through an optical mask which blocks the passage of light to those areas of the film where the apertures are desired, and permits the passage of light to all other areas of the film, whereby the latter areas become selectively crosslinked. The thus exposed film is then treated with a suitable solvent which selectively dissolves the uncrosslinked portions of the film, thereby producing the apertures.

Resists similar to those described above, but formed with varying thickness rather than with apertures, have also previously been prepared by means of the optical mask exhibiting a varying optical density profile. This results in variations in the amount of light received by different areas of the exposed photosensitive polymeric film, which produces corresponding variations in the extent to which such areas become crosslinked. When the thus exposed film is treated with a solvent which selectively dissolves uncrosslinked portions of the film, the resist is formed with variations in its thickness. These varying thickness resists have been used primarily as a means for controlling the rate of flow of etching solution in the production of printing plates for photographic reproduction processes, such as the photogravure process. However, the use of varying thickness resists in electrolytic applications does not appear to have been previously explored. In this regard electrolytic refers to processes in which a net electrical current is passed.

SUMMARY OF THE INVENTION

It is, accordingly, a primary object of the present invention to provide a novel electrolytic method for modulating the surface of an electrically conductive substrate to a predetermined profile, which offers greater versatility in its applications than the prior art techniques.

Another object of the invention is to provide an electrolytic surface modulation method in accordance with the proceding object, which enables the generation of a continuous surface modulation profile.

A further object of the invention is to provide an electrolytic surface modulation method in accordance with the preceding objects, which enables the generation of a surface modulation profile of varying depth.

Still another object of the present invention is to provide an electrolytic surface modulation method in accordance with the preceding objects, which enables the generation of a surface modulation profile characterized by extremely fine features.

A still further object of the invention is to provide an electrolytic surface modulation method in accordance with the preceding objects, which is convenient and economical to carry out.

The above and other objects are achieved in accordance with the present invention by masking the surface to be electrolytically modulated with an ionic conductance resist having ionically conductive body, i.e., now apertured, portions and exhibiting a trans-resist ionic conductance or resistance profile which patterns the desired modulated surface profile. The masked surface is then subjected to electrolysis so as to effect modulation of the surface by passage of ionic current to or from the surface, at least a substantial proportion of such passage occurring through the body portions of the resist, so that the rate of the of surface modulating ionic species passage at any given point along the masked portions of the surface is controlled by the trans-resist ionic conductance or resistance at that point. The electrolytic treatment is carried out for a period of time sufficient to thereby generate the predetermined desired surface profile. The resist is thereafter removed to thereby expose the resulting modulated surface.

The resist may be an inherent ionic conductor or may become conducting upon permeation with ions from the electrolytic solution.

DESCRIPTION OF PREFERRED EMBODIMENTS

The electrolytic surface modulation procedure in accordance with the present invention has a high degree of versatility in enabling the electrolytic generation on electrically conductive substrates of any desired predetermined surface modulation profile, i.e., continuous or discontinuous, of varying or uniform depth, and characterized by features which may range from extremely fine to relatively large. Such versatility is provided by carrying out the electrolytic treatment through an ionic conductance resist having body portions which are ionically conductive to controlled degrees so that the surface modulation is at least to a substantial degree effected by passage of ionic species to or from the surface through the ionically conductive body portions of the resist. By forming the resist with a trans-resist ionic conductance or resistance profile which patterns the desired predetermined surface profile, the resist serves as a means for controlling the rate of surface modulating ionic species passage at each point along the masked portion of the surface so that the desired predetermined surface profile is thereby generated.

The procedure of the present invention is particularly well suited for those applications wherein the desired surface modulation profile is continuous and/or of varying depth and/or characterized by extremely fine features, i.e., in the 1 to 100 micron range. Specific potential applications from the electronic and optical industries include, for example, circuit board fabrications; metalization and selective plating of microelectronic components; electroforming of fine grids and gratings; surface forming for integrated electro-optical devices; production of high frequency electronic devices and radar elements; fabrication of reflective infra red optical elements; display panels; and plated magnetic flux lines. Applications in more conventional metal forming industries include, for example, microfabrication of metal parts, e.g., lubrication channels; surface texturing of parts; non-destructive marking of accurately machined parts; controlled electropolishing and deburring of parts; production of plates for printing; and making decorative surface relief.

The ionic conductance resist employed in the practice of the present invention will generally be composed of a substantially continuous body of material, but may, where called for by any specific application, be formed with apertured portions. In any event, at least part of the body portions of the resist will be ionically conductive to a controlled degree. For those applications where a continuous surface modulation profile is desired, such controlled degree of ionic conductance will be exhibited along the entire area of the body portions of the resist.

For those applications where the desired surface modulation profile is of varying depth, the resist employed will be formed so as to exhibit a varying trans-resist ionic conductance or resistance profile. For example, the resist may be of varying thickness, so that the trans-resist ionic conductance at any given point along the resist will vary inversely with the thickness at that point. Such varying thickness ionic conductance resists may suitably be formed from a photosensitive polymeric film by techniques similar to those described above for preparing the varying thickness resists conventionally employed in the photogravure process. Thus, the photosensitive polymeric film is first exposed to light through an optical mask exhibiting an optical density profile which patterns the desired surface profile which is to be electrolytically generated. This results in variations in the amount of light received by different areas of the exposed photosensitive polymeric film, which produces corresponding variations in the extent to which such areas become crosslinked, thereby serving to induce the requisite ionic conductance or resistance profile in the resist. Such profile may then be further developed in the resist by treating the exposed film with a solvent which selectively dissolves uncrosslinked portions of the film, whereby the resist is formed with variations in its thickness, the trans-resist ionic conductance at any given point along the resist varying inversely with the thickness at that point.

Depending upon the particular photosensitive polymeric system employed, the above-described procedure for preparing varying thickness ionic conductance resists may be modified so as to eliminate the solvent treatment step. With some systems, the photo-reaction step alone will be sufficient to produce a varying thickness resist suitable for use in the present invention, the action of the light serving to simultaneously change the thickness of the film in proportion to the extent of photo-reaction. With other systems, the requisite varying trans-resist ionic conductance or resistance profile will be sufficiently induced in the film by the photo-crosslinking step so as to render the film suitable as a constant thickness varying conductance resist for use in accordance with the present invention.

Any of the various photosensitive or photosensitizable polymeric materials well known in the art can suitably be employed for forming the ionic conductance resists for use in the present invention. These include materials which are sensitive or sensitizable not only to visible light, but also to radiation in the infra red, ultra-violet, or other frequencies. Examples of photosensitive polymeric materials include polyvinyl acetate-vinylsorbate and polyvinyl ester acetal. Examples of polymeric materials which are photosensitizable (e.g., by the addition thereto of a dichromate solution) include the polyvinyl alcohols, gelatin, process (fish) glue, albumins, casein, starch and natural gums. Non polymeric materials, e.g., oxines, may be useful as well.

Instead of using the above-described optical mask technique for preparing the ionic conductance resists for use in the present invention, a thin pencil of light could be used to trace out the desired pattern on the photosensitive polymeric film. The light source could be, for example, a conventional focused beam of light or the beam from a laser. The beam could be traversed under either manual or computer control.

Formation of the ionic conductance resist is most conveniently carried out in situ on the surface to be modulated, by coating the photosensitive polymeric film onto the surface, for example, by spin-coating, dipping or spraying, prior to carrying out the exposure of the film to light. Alternatively, the resist may be be preformed and thereafter adhered to the surface to be modulated.

The procedure of the present invention also encompasses the use of ionic conductance resists which exhibit a uniform trans-resist ionic conductance or resistance profile, for those applications where the desired surface modulation profile is of uniform depth. For example, when plating precious metals or for corrosion protection, it is important to obtain uniform deposit, yet because of the geometry of the plated part, its position in the plating cell, or the plating conditions, the deposit is not of uniform thickness. In these instances, plating through an ionic conductance resist exhibiting a uniform trans-resist ionic conductance or resistance profile in accordance with the present invention, will yield uniform plate thickness irrespective of the other plating process parameters.

The electrolytic surface modulation effected by means of the procedure of the present invention, can suitably be either electrodeposition onto the surface being modulated, or electrodissolution of such surface. The electrically conducting substrate and plating ions may be metallic, e.g., copper, nickel, iron, cobalt, etc.; or semimetals, such as silicon and germanium. Also, the plating ions may be different from the substrate, for example, nickel electrodeposited on iron. Furthermore, modulated surfaces can be deposited on nonconducting backings, such as insulating polymers, by first depositing a thin layer of a conducting film onto the non-conductor by vapor deposition or other non-electrochemical means.

The specific conditions of the electrodeposition or electrodissolution procedure, i.e., the current density, applied potential, pH, etc., in any application will, of course, depend upon the system employed.

The invention is further illustrated by way of the following examples.

EXAMPLE 1

A varying thickness ionic conductance resist was prepared from a commercial gelatin, McGraw Colorgraph Type 37 gravure tissue, which is a medium contrast gelatin recommended for continuous tone etching. It is a paper backed layer of gelatin containing iron oxide pigment.

The gelatin was sensitized with a 3 weight percent solution of ammonium dichromate in distilled water. The tissue was submerged in the sensitizer, gelatin side up, and the gelatin surface gently rubbed to remove air bubbles. Total sensitizing time was three and a half minutes at 13° C. The sensitized tissue was squeegeed, gelatin side down, firmly onto a drying support of plexiglass which had been cleaned with a 50% alcohol solution. Placed in front of a fan and given a quarter turn every 15 minutes, the gelatin dried, and peeled off the drying support within two hours.

The sensitized gelatin was exposed through a Kodak grey scale mask in a contact printer for four minutes using an exposure of approximately 200,000 foot candle seconds. This grey scale has 20 steps in 0.10 density increments between a nominal "white" of 0.0 and a practical printing "black" of 1.90 density.

To insure good adhesion, a polished copper substrate was emersed in a 5 weight percent $H_2SO_4$ solution for two minutes immediately preceding laying down the gelatin. This acid etched copper was coated with a thin layer of distilled water. The exposed gelatin was immediately placed, gelatin side down, on this copper and then rapidly squeegeed. Excess water was blotted up and the copper with the adhered gelatin was placed in a draftless area to dry. After 10 minutes, when the paper backing felt dry to the touch, the paper backing was wet with alcohol and immediately emersed in hot water (46° C.). After rapidly moving the disk in the water for two minutes, the paper backing was easily removed. Development was continued for an additional four minutes. The disk with the adhered gelatin was then emersed in room temperature distilled water for three minutes. Finally, the gelatin was saturated with a 75% isopropyl alcohol solution for five minutes and permitted to dry for at least several hours before plating.

The gelatin covered copper was cathodically polarized in a 1 Molar $H_2SO_4$/1 Molar $CuSO_4$ solution. A Brinkman potentiostat was used to provide a constant current density of 10 ma/cm$^2$ across the copper surface. Plating was carried out at this constant current density for 15 minutes. No agitation was used and the electrolyte solution was at ambient temperature throughout the experiments. The anode was also a copper disk and the average distance between the electrodes was 6 cm. After plating, the gelatin was removed in an ultrasonic bath of hot (70° C.) water.

The plated copper thickness was found to be nearly a linear function of the optical density of the optical mask employed in forming the ionic conductance resist. The plating contrast was found to be 0.4 microns for a change of 0.1 in the optical density of the mask. The plating contrast was approximately 10% of the height differences between the optical steps in the gelatin before plating (4.53 microns).

EXAMPLE 2

The resolution of the procedure was tested by plating through gelatin that had been exposed to a grating. The gratings were Edmund Scientific Ronchi Rulings with sizes of 200, 250, and 300 lines per inch.

A spacial resolution of about 40 microns (300 plated lines per inch) was achieved. The estimated grain size of the gelatin used in these experiments as 25 microns. Much better resolution, in the single micron range, has been achieved using finer grain size gelatins, e.g., Baker Chemical Co. USP Gelatin.

We claim:

1. A method of electrolytically modulating the surface of an electrically conductive substrate to a predetermined profile, comprising the steps of:
   (a) masking said surface with an ionic conductance resist having ionically conductive body portions and exhibiting a trans-resist ionic conductance or resistance profile which patterns said predetermined surface profile;
   (b) subjecting the masked surface to electrolytic treatment with an ionic solution so as to effect modulation of said surface by passage of ionic species to or from said surface, at least a substantial proportion of said passage occurring through said body portions of said resist, the rate of said surface modulating ionic species passage at any given point along the masked portion of said surface being controlled by the transresist ionic conductance or resistance at that point, said electrolytic treatment being carried out for a period of time sufficient to thereby generate said predetermined surface profile; and
   (c) removing said resist to thereby expose the resulting modulated surface.

2. The method of claim 1, wherein said resist is composed of a substantially continuous body of material and exhibits a varying trans-resist ionic conductance or resistance profile.

3. The method of claim 2, wherein said resist is of varying thickness, and the trans-resist ionic conductance at any given point along said resist varies inversely with the thickness at that point.

4. The method of claim 2, wherein said resist is formed by exposing a photosensitive polymeric film to light through an optical mask exhibiting an optical density profile which patterns said predetermined surface profile, the variations in the amount of light received by different areas of the thus exposed film producing corresponding variations in the extent to which said areas become crosslinked, thereby serving to induce the requisite ionic conductance or resistance profile in said resist.

5. The method of claim 4, wherein the requisite ionic conductance or resistance profile is further developed in said resist by treating said exposed film with a solvent which selectively dissolves uncrosslinked portions of said film, whereby the resist is formed with variations in its thickness, the trans-resist ionic conductance at any given point along said resist varying inversely with the thickness at that point.

6. The method of either of claims 4 or 5, wherein said photosensitive polymeric film is coated onto said surface being modulated prior to carrying out said exposure of said film to light.

7. The method of claim 1, wherein said electrolytic treatment is electrodeposition onto said surface.

8. The method of claim 7, wherein a metallic species is electrodeposited onto a metallic substrate.

9. The method of claim 1, wherein said electrolytic treatment is electrodissolution of said surface.

10. The method of claim 4 or 5, wherein the photosensitive polymeric film is exposed prior to being plated onto said surface being modulated.

* * * * *